INVENTOR.
Clement R. Tompson
BY John J. Pederson
Attorney

April 8, 1969 C. R. TOMPSON 3,437,936

AUTOMATIC RADIO TUNER FOR BLIND-TUNING TO A PREDETERMINED FREQUENCY

Filed Dec. 16, 1965

INVENTOR.
Clement R. Tompson
BY John J. Pederson
Attorney

INVENTOR.
Clement R. Tompson
BY John J. Pederson
Attorney

United States Patent Office 3,437,936

Patented Apr. 8, 1969

3,437,936

AUTOMATIC RADIO TUNER FOR BLIND-TUNING TO A PREDETERMINED FREQUENCY

Clement R. Tompson, Melrose Park, Ill., assignor to Zenith Radio Corporation, Chicago, Ill., a corporation of Delaware Filed Dec. 16, 1965, Ser. No. 514,227

Int. Cl. H04b *1/06;* H03j *5/02*

U.S. Cl. 325—456 6 Claims

ABSTRACT OF THE DISCLOSURE

An automatic tuning system for accomplishing rapid blind-tuning of a radio receiver to a predetermined carrier frequency. An electrical switch mechanically coupled to the receiver tuning shaft is angularly positioned on that shaft to energize the receiver only when it is tuned to the desired frequency, thereby audibly informing a listener that he has tuned to the desired station. Circuitry may be included for predetermining the volume level at which the receiver will operate when it is blind-tuned to the desired station.

This invention relates to so-called automatic tuning devices for wave-signal receivers such as radio receivers or the like and more particularly to electromechanical tuning mechanisms for accomplishing rapid blind-tuning of a receiver to a predetermined broadcast station.

It is often desired that a radio receiver be provided with an automatic tuning device to enable an operator to rapidly and conveniently tune in one or more preselected stations without having to look at dial calibrations. Many blind-tuning systems have been devised for achieving this objective, particularly in automobile receivers and in large console receivers. These systems have either relied on a combination of levers and cams to position a tuning shaft to a predetermined angular position, or have had a plurality of switch selected tuned circuits, each adjusted to a desired station. Although these devices have seen wide use, high cost, large size and complexity have prevented their use in low-priced portable and table model radio receivers.

Accordingly, it is an object of this invention to provide a new and improved automatic tuning device for blind-tuning a radio receiver to one or more preselected stations.

It is a further object of this invention to provide a simplified mechanical tuning device which will enable a radio receiver to be rapidly tuned for operation on one or more preselected frequencies.

It is a still further object of this invention to provide a mechanical tuning device for a radio receiver which will render the receiver instantly operative when it is tuned to one or more preselected carrier frequencies.

In accordance with the invention, a radio receiver or the like is adapted for receiving any of a plurality of modulated carrier signal transmissions at individually assigned carrier frequencies within a predetermined frequency band, and is further adapted for blind-tuning to receive signal transmissions at a preselected one of those frequencies. The receiver comprises signal receiving, translating, and detecting circuits which include a tuning element adjustable over a predetermined range for tuning the receiver to different frequencies within the predetermined frequency band. Included are means coupled to this tuning element and responsive to its position in the predetermined range of adjustmet for rendering the receiver inoperative when tuned to frequencies other than the preselected frequency.

The features of this invention which are believed to be novel are set forth with particularly in the appended claims. The invention, together with further objects and advantages thereof, may best be understood, however, by reference to the following description taken in conjunction with the accompanying drawings, in the several figures of which like reference numerals identify like elements, and in which:

Figures 1, 2, 3:
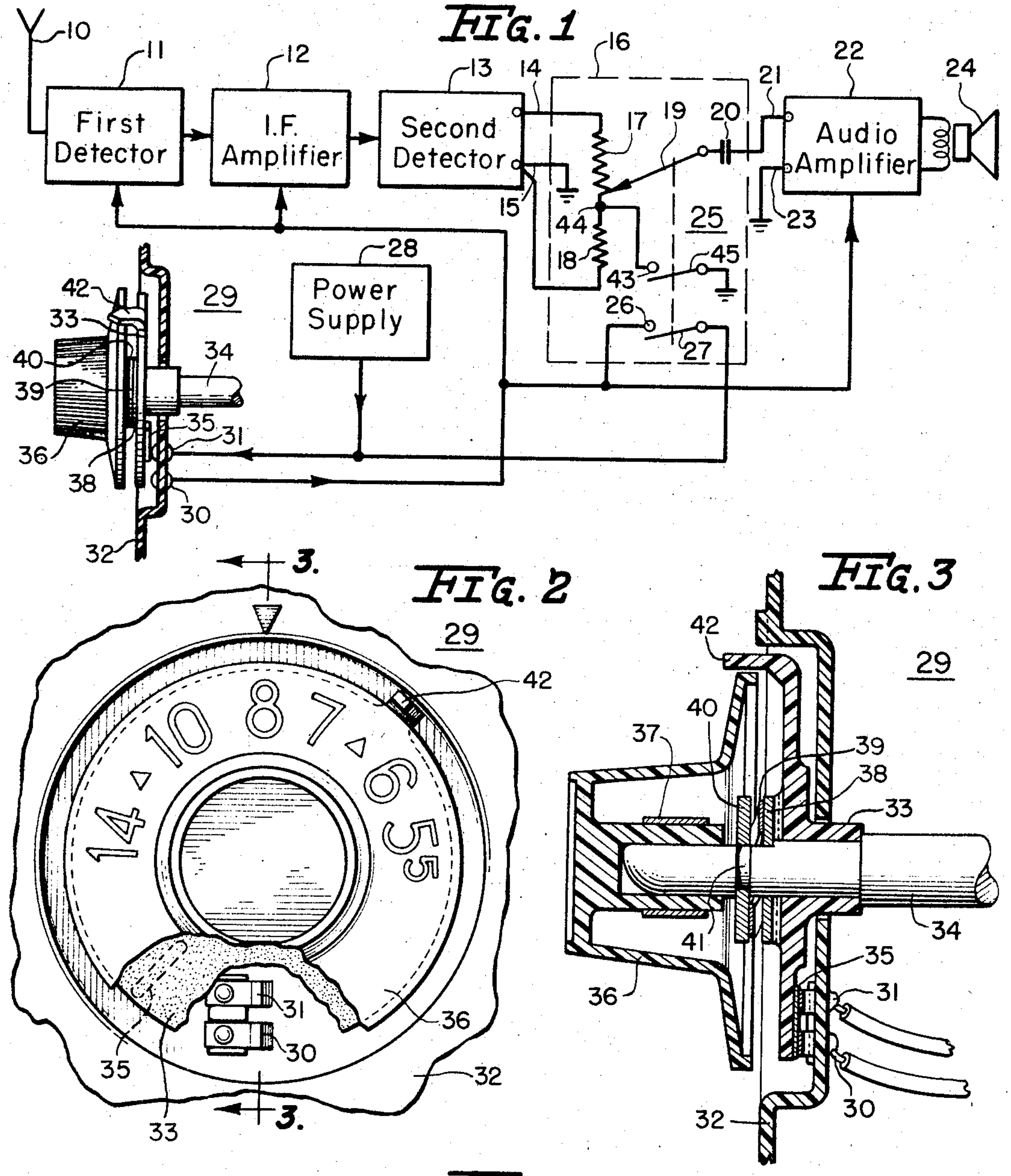
FIGURE 1 is a schematic circuit diagram of a radio receiver apparatus adapted for blind-tuning in accordance with a preferred embodiment of the invention, with the tuning element shown in side elevation and partly in cross section.
FIGURE 2 is a front elevational view, partly cut away, of the tuning element of the receiver of FIGURE 1.
FIGURE 3 is a cross-sectional view taken along lines 3—3 of FIGURE 2.

The radio receiver apparatus shown in FIGURE 1 is of solid-state superheterodyne design and comprises an antenna 10 coupled in a conventional manner to a heterodyning stage or first detector 11. First detector 11 is coupled to an intermediate frequency amplifier 12 which, in turn, is coupled to a second detector 13. The output of second detector 13 appears at terminals 14 and 15, and is coupled to an interstage audio circuit enclosed by dash outline 16. Terminals 14 and 15 are shunted by a voltage divider network serially comprising a potentiometer 17 and a fixed resistor 18. Potentiometer 17 is connected to terminal 14 and resistor 18 is connected to terminal 15, which is grounded. Potentiometer 17 and resistor 18 are connected at a junction 44. The arm 19 of potentiometer 17 is coupled by a capacitor 20 to one input terminal 21 of an audio amplifier stage 22. The other input terminal 23 is grounded and the output of this stage is coupled to a suitable speaker 24. A double-pole single-throw electric switch 25 serves as an on-off power switch, having one set of contacts 26 and 27 serially included in a circuit coupling power supply 28, preferably and conveniently a battery supply, to the various stages of the receiver; i.e., 11, 12, and 22, Another set of contacts 43 and 45 on switch 25 connects junction 44 to ground when the switch is in the on position.

In general, the radio receiver apparatus of FIGURE 1 is entirely conventional; accordingly only a very brief description of its operational characteristics need be given here. The receiver is turned on by closing switch 25 which connects power supply 28 to the receiver circuitry. In operation, a modulated carrier signal transmission is intercepted by antenna 10 and coupled to first detector 11, wherein it is heterodyned or translated to a suitable intermediate frequency. This signal is then amplified in intermediate frequency amplifier 12 and demodulated by a second detector 13, appearing as an audio signal at terminals 14 and 15. Potentiometer 17 acts as an adjustable voltage divider to this signal, enabling the operator to vary the magnitude of the audio signal coupled to audio amplifier 22 by varying the position of arm 19. Capacitor 20 couples the audio signal from arm 19 to input terminal 21 of audio amplifier 22; the other input terminal 23 is grounded. The output of audio amplifier 22 drives loudspeaker 24 to render the audio signal audible.

In accordance with the invention, the radio receiver shown in FIGURE 1 is adapted for blind-tuning to a preselected carrier frequency. This is accomplished by the addition of an electric switch device 29, which operates in conjunction with the receiver tuning element and is more fully illustrated in FIGURES 2 and 3. Device 29 comprises a pair of spaced-apart contacts 30 and 31 mounted on the receiver housing 32, which is formed of a plastic or other insulating material, and resiliently biased against an annular insulating disc 33 which is concentrically mounted on the receiver tuning shaft 34. Tuning shaft 34 is manually and continuously adjustable over a maximum range of 360° or less and has a unique angular position associated with the preselected carrier frequency. A radially oriented metallic segment 35, affixed to the annular disc 33, is disposed to electrically connect contacts 30 and 31 when tuning shaft 34 assumes this unique angular position. For operator convenience a tuning knob 36 is concentrically mounted on tuning shaft 34 and frictionally held in position as a consequence of bias exerted by a spring band 37, as shown in FIGURE 3. A washer 38, concentrically mounted on shaft 34 and keyed to rotate therewith, is urged into frictional contact with disc 33 by a spring washer 39 acting in cooperation with a C-washer 40. Washer 40 is entrapped by a slot 41 on shaft 34 to force spring washer 39 to bear against washer 38. The combination of washers 38, 39 and 40 and disc 33 forms a clutch which slip-frictionally couples disc 33 to shaft 34. A tab 42 is peripherally mounted to annular disc 33 and protrudes forward beyond knob 36 for convenience in setting the angular position of disc 33 relative to tuning shaft 34.

Contacts 30 and 31 of device 29 are connected to contacts 26 and 27, respectively, which comprise one section of switch 25. The other section of switch 25 has a terminal 43 connected to the junction 44 of potentiometer 17 and resistor 18, and another terminal 45 connected to ground. Switch 25 is mechanically coupled to arm 19 of volume control potentiometer 17, so that when arm 19 is in the minimum volume position, or nearest to junction 44, switch 25 is in the off position. When arm 19 is rotated from this minimum volume position towards a position of increasing volume, switch 25 is energized in the on position and contacts 43 and 45 are connected together, as are contacts 26 and 27.

In operation, the operator first preselects the station to which the receiver will be subsequently blind-tuned. To do this, he first turns on the receiver and tunes in the desired station. He then turns the receiver off by opening switch 25, and while holding tuning control shaft 34 fixed, rotates disc 33 by means of tab 42 until the receiver again becomes operative. The angular position of disc 33 is now set relative to tuning shaft 34 so that contacts 30 and 31 will be closed whenever the desired station is tuned in.

Assuming that the preselection has been made and the receiver is arbitrarily tuned to some station other than the one preselected, the operator can now quickly and accurately blind-tune the desired station. With the receiver switched off, he merely tunes (rotates tuning control shaft 34) until the radio becomes operative, his cue that he has positioned the tuning shaft for operation on the desired frequency. Because the receiver is fully transistorized, no warm-up time is needed and the receiver is always ready, without the use of standby power from battery 28, for instant use on either a normal or a blind-tuning basis.

The volume level at which the receiver operates when the preselected station is blind-tuned is determined by resistor 18, which serves as part of a voltage divider network across the second detector output terminals 14 and 15. While the receiver is being blind-tuned potentiometer 17 is in the minimum volume position and switch 25 is open. Arm 19 is effectively connected to junction 44, and the portion of the second detector signal which appears across resistor 18 is coupled by capacitor 20 to audio amplifier stage 22, wherein it is amplified to drive speaker 24. Once the desired station has been found, potentiometer 17 is ordinarily adjusted by the operator for some nominal volume level. In doing this, he actuates switch 25 to the closed or on position and causes junction 44 to be grounded through contacts 43 and 45. The entire detector output signal now appears across potentiometer 17, and arm 19 can be adjusted for any desired listening level within the capabilities of the receiver. Contacts 26 and 27 on switch 25 are also closed, the blind-tuning switch device is shunted, and the receiver is restored to normal operation. Of course, the receiver can always be operated in the normal manner to select any desired station, including the station selected for the blind-tuning capability.

By removing resistor 18, switch contacts 43, 45 and the mechanical ganging connection between switch 25 and potentiometer 17, the receiver can be preset by preadjustment of potentiometer 17 to operate at any desired volume level on blind-tuning to the desired station; however this requires the provision of an additional control knob for the receiver. In this event, the operator sets up the receiver for blind-tuning by first turning off switch 25 and presetting potentiometer 17 to the desired nominal setting, and then adjusting tab 42 as before.

Figure 4:
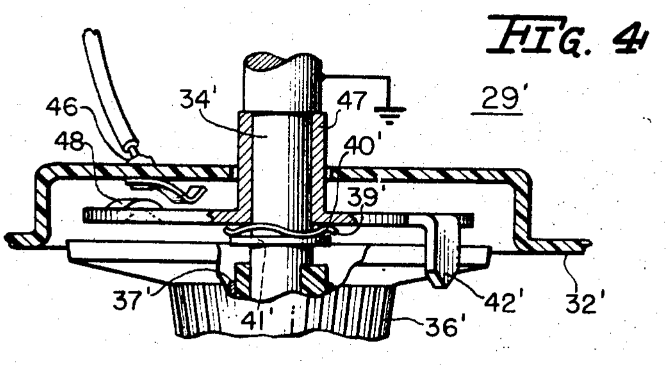
FIGURE 4 is a cross-sectional view of an alternative tuning element adapted for use in a radio receiver constructed in accordance with the invention.

FIGURE 4 illustrates another form of switch device 29' adapted for use in a receiver constructed in accordance with the invention. This embodiment employs a single electrical contact 46 instead of a pair of spaced-apart contacts as employed in the embodiment of FIGURES 1, 2 and 3. This single contact 46 is mounted on the nonconductive receiver housing 32' and protrudes towards an annular metallic disc 47 which is concentrically mounted on tuning shaft 34'. Disc 47 has a kickup contact 48 disposed on its face for making electrical connection with contact 46 when the disc assumes a predetermined angular position. A spring washer 39' is concentrically mounted on shaft 34' between a C-washer 40' and disc 47 to frictionally couple disc 47 to tuning shaft 34. C-washer 40' is captivated by a slot 41' contained on shaft 34' and is keyed to rotate therewith. For operating convenience, a tuning knob 36' is concentrically mounted on tuning shaft 34' and frictionally held in position as a consequence of bias exerted by spring band 37'. A tab 42' is peripherally mounted on annular disc 47 and protrudes forward beyond knob 36' for convenience in setting the angular position of disc 47 relative to tuning shaft 34'. Annular disc 47 is electrically coupled to shaft 34', which, in this case, is grounded.

Operation of this embodiment is similar to that of the embodiment of FIGURE 1. The operator first angularly prepositions annular disc 47 relative to shaft 34' so that contacts 46 and 48 will close when tuning shaft 34' is mechanically adjusted to cause reception on the preselected frequency. The switch apparatus 29' of FIGURE 4 is adapted to be utilized in conjunction with receiver apparatus similar to that shown in FIGURE 1, except that contact 26 of switch 25 is connected to ground while contact 27 is connected to switch terminal 46.

Figures 5, 6:
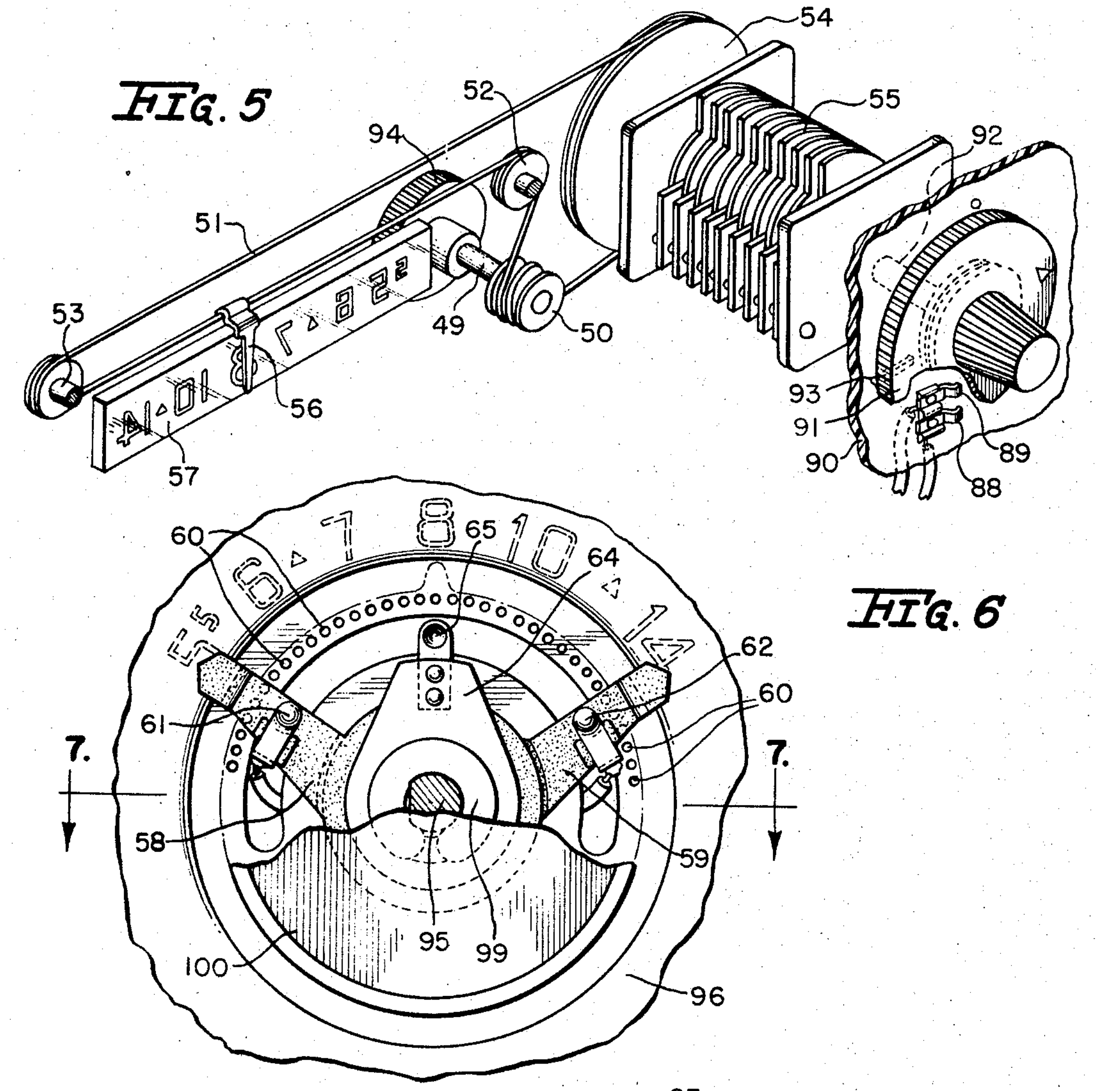
FIGURE 5 is a perspective view of tuning apparatus for use in a receiver having a slide-rule dial for indication of receiver operating frequency and embodying the invention.
FIGURE 6 is a front elevational view, partly cut away, of another switch mechanism for use in a radio receiver or the like constructed in accordance with the invention and adapted for independent preselection of two different operating frequencies.

FIGURE 5 illustrates another embodiment of the invention in which a slide-rule dial indicates the operating frequency of the receiver. With reference to the figure, the receiver tuning knob 94 is rotationally coupled by a shaft 49 to a pulley 50. A dial cord 51 is frictionally driven by pulley 50 to traverse a path defined by pulleys 52, 53 and 54. Pulley 54 is concentrically mounted on tuning shaft 92 and is driven by dial cord 51 to adjust tuning capacitor 55. A pointer 56 is attached to dial cord 51 between pulleys 52 and 53 and is adapted to linearly traverse a calibration scale 57 as tuning shaft 92 completes one-half revolution. A switch device mechanically coupled to this tuning element connects to receiver circuitry similar to that shown in FIGURE 1. This switch device comprises a nonconductive annular disc 91 concentrically mounted on and slip-frictionally coupled to tuning shaft 92, which extends through an aperture in the back of the receiver housing 90. A metallic segment 93, affixed to a face of disc 91, is disposed to electrically connect contacts 88 and 89 when shaft 92 assumes a predetermined angular position.

In operation, the operator imparts rotary motion to tuning knob 94 which is translated by dial cord 51 to rotary motion at a reduced angular velocity in tuning shaft 92 and rectilinear motion of pointer 56 across calibration scale 57. Rotation of shaft 92 varies the capacity of tuning capacitor 55, thus changing the operating frequency of the receiver. The particular switch device shown in FIGURE 5 operates similarly to its counterpart in the embodiment of FIGURE 1 and likewise must be preset to the desired station. The operator first turns off the receiver, and while holding knob 94 fixed, rotates disc 91 until the receiver again becomes operative. The angular position of disc 91 is now set relative to tuning shaft 92 so that contacts 88 and 89 will be closed whenever the desired station is tuned in. Assuming this preselection has been made, to blind-tune the station thereafter the operator need only switch the receiver off and rotate shaft 92 until the receiver again becomes operative, at which time he will be tuned to the preselected station.

Figure 7:
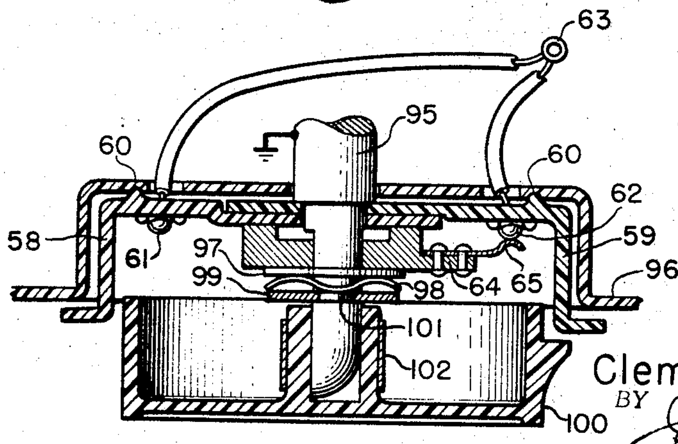
FIGURE 7 is a cross-sectional view taken along lines 7—7 of FIGURE 6.

FIGURES 6 and 7 illustrate an electric switch device constructed in accordance with the invention which permits blind-tuning to either of two different preselected stations. A pair of electrical contacts 61 and 62 are individually mounted on separate nonconductive radial arms 58 and 59, respectively, which are concentrically mounted on shaft 95 and held in selected angular positions by a segment 60 of detents molded into receiver housing 96. Alternatively, to permit finer adjustments, these detents could be provided on separate rotatable tabs which would in turn be held in position by a detent segment on the receiver housing. A metallic arm 64 is also concentrically mounted on shaft 95 and has an electrical contact 65 disposed to resiliently connect with either of contacts 61 and 62 when arm 64 is moved to an angular position occupied by the corresponding radial arm. A washer 97, a spring washer 98 and a C-washer 99 are concentrically mounted on shaft 95 to cooperatively urge arms 58 and 59 against detent segment 60. Metallic arm 64 is keyed to rotate with shaft 95 and washer 99 is captivated on shaft 95 by a slot 101. Tuning knob 100 is concentrically mounted on tuning shaft 95 and frictionally held in position as a consequence of bias exerted by spring band 102. Contacts 61 and 62 are electrically connected at junction 63, and shaft 95, in this particular instance, is grounded.

In operation, arms 58 and 59 are individually prepositioned by the operator to respective first and second angular positions corresponding to first and second desired operating frequencies. In each case this is done by tuning in the desired station, and after turning off the receiver, moving the arm until the receiver again operates. Thereafter, when tuning shaft 95, and consequently arm 64 and contact 65, assume either of these preselected positions, an electrical circuit is completed between junction 63 and shaft 95 and the receiver is rendered operative. It is intended that this electrical switch be used in conjunction with receiver apparatus adapted for blind-tuning, such as shown in FIGURE 1.

Figure 8:
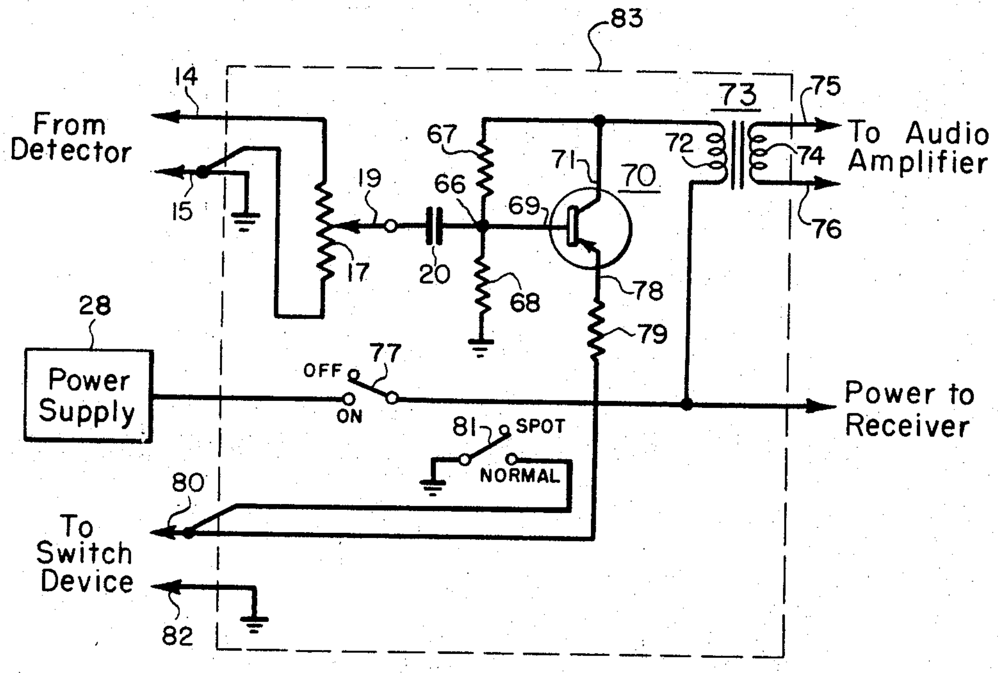
FIGURE 8 is a schematic diagram of a transistor audio amplifier stage adapted for use in a radio receiver or the like constructed in accordance with the invention.

In FIGURE 8 is shown a transistor audio stage adapted for use in a receiver constructed in accordance with the invention. Potentiometer 17 shunts output terminals 14 and 15 of the preceding second detector stage and terminal 15 is grounded. Arm 19 of potentiometer 17 is coupled by capacitor 20 to junction 66, formed by resistors 67 and 68 and base electrode 69 of transistor 70. Resistor 68 is grounded and resistor 67 is connected to the collector electrode 71 of transistor 70 and to one terminal of the primary winding 72 of audio transformer 73. The other terminal of primary winding 72 is connected through switch 77 to power supply 28. The secondary winding 74 of transformer 73 is coupled to input terminals 75 and 76 of a subsequent audio amplifier stage. The emitter electrode 78 of transistor 70 is coupled by resistor 79 to terminal 80, which is connected to ground by a circuit serially including a single-pole single-throw function switch 81. Switch 81 is closed when the receiver apparatus is set for normal operation and is open when the receiver is to be blind-tuned. Terminal 80 and grounded terminal 82 are intended to be connected to a switch device constructed in accordance with the invention, such as the switch devices previously described in connection with FIGURES 2 through 7.

The audio amplifier stage enclosed in dash outline 83 is entirely conventional in operation, and accordingly, a detailed explanation need not be given here. An audio signal from the preceding detector stage appears across potentiometer 17 which serves as a voltage divider to this signal. Capacitor 20 couples the signal from arm 19 of potentiometer 17 to base electrode 69 of transistor 70, which is biased in a conventional manner by resistors 67 and 68. During normal operation function switch 81 is closed and emitter electrode 78 of transistor 70 is connected to ground through resistor 79 and switch 81. The emitter electrode 78 being so grounded, an amplified output signal is available at collector 71 and is coupled by audio interstage transformer 73 to the input terminals 75 and 76 of a subsequent audio amplifier stage.

Before blind-tuning, the operator opens function switch 81 which disconnects emitter electrode 78 from ground. This renders audio amplifier stage 83, and consequently the receiver, inoperative until the emitter is again connected to ground by closure of terminals 80 and 82. A switch device, similar to those described in FIGURES 1 through 7, closes these terminals when the operator has blind-tuned to the preselected operating frequency.

Figure 9:
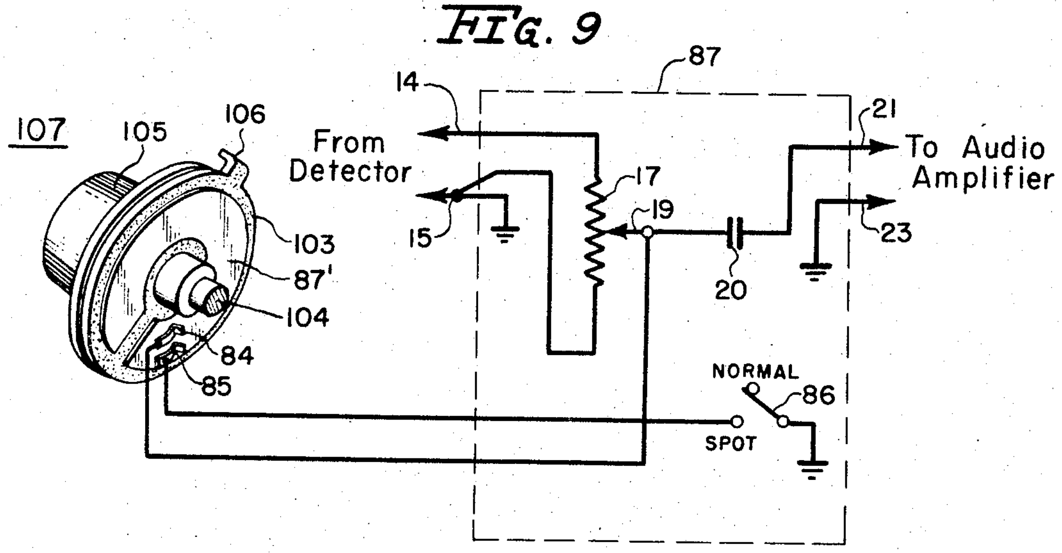
FIGURE 9 is a schematic diagram of an audio interstage coupling network connected to a switch device, shown in perspective, for use in a radio receiver constructed in accordance with the invention.

FIGURE 9 illustrates an audio interstage translating circuit adapted for use in a receiver constructed in accordance with the invention. The circuit, enclosed by dashed outline 87, is rendered inoperative by an electrical switch device 107 mechanically coupled to the receiver tuning apparatus. Potentiometer 17 is shunted across output terminals 14 and 15 of the preceding second detector stage and terminal 15 is grounded. Arm 19 of potentiometer 17 is coupled by a capacitor 20 to one input terminal 21 of a succeeding audio amplifier stage and the other input terminal 23 is grounded. A circuit serially including a pair of contacts 84 and 85 on switch device 107 and an electrical switch 86 connects arm 19 to ground. Contacts 84 and 85 are resiliently biased against a nonmetallic annular disc 103 which is slip-frictionally coupled to a tuning shaft 104. A metallic segment 87 affixed to disc 103 extends circumferentially around shaft 104 to cause electrical closure of contacts 84 and 85 in all but one unique angular position of disc 103. A tuning knob 105 is coupled to shaft 104 for convenience in tuning and a tab 106 is provided on disc 103 for convenience in setting the angular position of disc 103 relative to tuning shaft 104.

During normal operation of the receiver, switch 86 is open and arm 19 is not connected to ground. However, in the blind-tuning mode switch 86 is closed and arm 19 is grounded, thus rendering the receiver inoperative. This condition exists until disc 103 assumes the unique position where conductive segment 87 does not electrically connect contacts 84 and 85. When this happens arm 19 is no longer grounded, and the receiver operates. Of course, the angular position of disc 103 relative to shaft 104 must be predetermined by the operator so that contacts 84 and 85 will open when shaft 104 is positioned to cause operation on the desired frequency.

Blind-tuning systems constructed in accordance with the invention, of which the above described embodiments serve as examples, are well suited for use in mass-produced consumer radionic products. Few additional components are required to adapt a radio receiver to this blind-tuning system, and the added cost of these components compared with the cost of even the less-expensive transistor portable receivers is relatively small. The switch device itself is of small physical size, and therefore can be readily adapted for use in miniature portables as well as in the larger home table receivers. Although the switch devices shown in the embodiments utilize electrical contacts mechanically coupled to the receiver tuning shaft, other switch devices, such as photo-electric cells and capacity-operated relays, could be used as well. Another advantage of the invention is that there is no standby power drain when the invention is used in conjunction with battery powered transistor sets. Furthermore, preselecting a station to be subsequently blind-tuned is a simple matter, and the selection can be quickly and easily changed even by inexperienced operators. With this invention blind-tuning is no longer restricted to the more expensive and cumbersome receivers, but is practical on almost all types of radio receivers.

While particular embodiments of the present invention have been shown and described, it will be obvious to those skilled in the art that changes and modifications may be made without departing from the invention in its broader aspects. Accordingly, the aim in the appended claims is to cover all such changes and modifications as may fall within the true spirit and scope of the invention.

I claim:

1. A radio receiver or the like adapted for receiving any of a plurality of modulated carrier signal transmissions at individually assigned carrier frequencies within a predetermined frequency band, and further adapted for blind-tuning to receive signal transmissions at a preselected one of said frequencies, said receiver comprising:

a normally open control circuit for rendering said receiver inoperative;

a manually operable tuning element for tuning said receiver to different frequencies within said frequency band, said tuning element having a unique position associated with said preselected frequency;

and electric switch means for closing said control circuit in response to said tuning element being positioned at said unique position.

2. A radio receiver as recited in claim 1, which includes means for predetermining the audio volume level at which said receiver will operate when rendered operative by closure of said control circuit.

3. A radio receiver as recited in claim 1, in which said switch means comprises a first contact mechanically coupled to said tuning element and a second contact disposed to connect with said first contact when said tuning element is positioned at said unique position.

4. A radio receiver as recited in claim 3, in which said tuning element comprises a rotatable shaft having a contact supporting structure mounted concentrically thereon, and in which said first contact is mounted on said supporting structure.

5. A radio receiver or the like adapted for receiving any of a plurality of modulated carrier signal transmissions at individually assigned carrier frequencies within a predetermined frequency band, and further adapted for blind-tuning to receive signal transmissions at a preselected one of said frequencies, said receiver comprising:

means for supplying electrical power to said receiver comprising an electric power source and a normally open control circuit for coupling said power source to said receiver;

a manually operable tuning element, including a shaft rotatable over not more than 360° and having a position uniquely associated with said preselected frequency, for determining the operating frequency of said receiver;

an annular disc slip-frictionally coupled to said shaft and angularly rotatable relative thereto and having a flat nonconductive end-face;

an electrical contact assembly comprising a contact resiliently engaged against said end-face and serially included in said control circuit;

and a metallic segment disposed on said face and adapted to cooperate with said contact assembly in closing said control circuit in response to said shaft being positioned for reception on said preselected frequency.

6. A radio receiver as recited in claim 5, in which said electrical contact assembly comprises a pair of spaced-apart contacts spring-biased against said end-face and serially included in said control circuit.

References Cited

UNITED STATES PATENTS

| | | | |
|---|---|---|---|
| 2,211,539 | 8/1940 | Fitzgerald | 325—456 |
| 2,511,602 | 6/1950 | Sperber | 325—456 |

KATHLEEN H. CLAFFY, *Primary Examiner.*

CHARLES JIRAUCH, *Assistant Examiner.*

U.S. Cl. X.R.

334—52